(12) United States Patent
Nagasu et al.

(10) Patent No.: US 6,304,472 B1
(45) Date of Patent: Oct. 16, 2001

(54) ELECTRIC POWER CONVERTING SYSTEM WITH INTEGRATOR PROVIDING OUTPUT INDICATIVE OF CURRENT

(75) Inventors: Masahiro Nagasu, Hitachinaka; Shin Kimura, Hitachi; Mutsuhiro Mori, Mito; Kiyoshi Nakata, Nishiibaraki-gun; Mutsuhiro Terunuma, Mito, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/570,034

(22) Filed: May 12, 2000

(30) Foreign Application Priority Data

May 14, 1999 (JP) .................................................. 11-133727

(51) Int. Cl.$^7$ ..................................................... H02M 3/24
(52) U.S. Cl. .............................. 363/97; 363/131; 323/282
(58) Field of Search ..................................... 323/266, 282, 323/285, 284, 289, 290, 292, 311; 327/108, 109, 110; 363/37, 95, 97, 98, 131, 132

(56) References Cited

U.S. PATENT DOCUMENTS

| | | | |
|---|---|---|---|
| 5,581,452 | * | 12/1996 | Yamamoto .............................. 363/41 |
| 5,617,306 | * | 4/1997 | Lai et al. ............................... 323/284 |
| 5,892,643 | * | 4/1999 | Esser et al. ............................. 361/18 |

* cited by examiner

*Primary Examiner*—Peter S. Wong
*Assistant Examiner*—Gary L. Laxton
(74) *Attorney, Agent, or Firm*—Antonelli, Terry, Stout & Kraus, LLP

(57) ABSTRACT

In order to detect a current with high accuracy in an electric power converting system, an inductor is connected to a main terminal of a switching element in series, and a voltage generated in both ends of the inductor during switching period is integrated using an integrating circuit to detect the current.

11 Claims, 11 Drawing Sheets

ELECTRIC POWER CONVERTING SYSTEM WITH INTEGRATOR PROVIDING OUTPUT INDICATIVE OF CURRENT

BACKGROUND OF THE INVENTION

The present invention relates to an electric power converting system using switching elements.

Measuring of currents at various portions in an electric power converting system has been widely performed.

For example, a measured result of current is used for judging whether or not an over current is flowing in an element such as an IGBT (insulated gate bipolar transistor) or a MOSFET due to occurrence of a short-circuit in the element. Because an element such as an IGBT or the like has the current saturation characteristic that an output current is limited by the gate voltage, the current can be turned off without breakdown if the current is turned off within several tens μs in the event of occurrence of a short-circuit status in which a voltage of a power source is directly applied to the element. Therefore, it is becoming more common that an electric power converting system comprises some means capable of judging occurrence of the short-circuit status, and contains a short-circuit protective unit for self-turning off the element when it is judged that the short-circuit status occurs in the element.

The method of judging occurrence of a short-circuit status commonly used is that current flowing in an element is measured and it is judged occurrence of the short-circuit status when the measured current exceeds a reference value. Various methods of detecting the current are known. For example, a technology disclosed in Japanese Patent Application Laid-Open No. 5-267580. In the method, an auxiliary element dedicated to measuring current flowing through an element is connected to the element in parallel, and the current is measured by a voltage generated in a resistor connected to the auxiliary element in series. This method has an advantage in that a large current can be measured because a part of current flowing through the main element flows through the auxiliary element. Therein, the auxiliary element is usually included inside a chip together with the main element.

There are the other methods of measuring current flowing through an element, one method is that a voltage is measured by directly connecting a resistor to a main element in series, not using the auxiliary element, and another method is that a voltage is measured by arranging a current transformer in a wire of a main element. These methods have an advantage in that the current can be read with a high accuracy because the current flowing through the element is directly read.

Recent electric power converting systems are not only equipped with the protective unit described above, but also being improved in performance of PWM control. As one of the examples, there is vector control of an induction motor. Although the induction motor is widely used because it is simple and tough in structure of the rotor and low in price, it is necessary to use a vector control technology in order to stably drive the induction motor.

Similarly to the protection of short-circuit, the vector control also requires to measure current with high accuracy. In the vector control, it is necessary to read current flowing Inti the motor as the control information, and the current is usually measured by a voltage generated between terminals of a resistor inserted in a wire between an inverter and the motor or by a current detector such as a current transformed attached to the wire.

As described above, the electric power converting system requires to measure currents in the switching elements and the motor with high accuracy, and the currents are measured using the auxiliary element, the resistor or the current transformer.

However, the conventional methods of measuring the currents have the following problems.

In the method of measuring current using the auxiliary element, the series circuit of the auxiliary element and the resistor is connected to the main element in parallel, and a current is read from a voltage generated in the resistor. Because the voltage applied between the terminals of the main element is divided by the auxiliary element and the resistor in the side of the auxiliary element, voltage applied between the terminals is different between the main element and the auxiliary element. Further, since the voltage generated in the resistor is increased in proportional to the current value flowing through the resistor, the ratio of the voltage applied to the main element to the voltage applied to the auxiliary element varies depending on the current value. Therefore, the method of using the auxiliary element is difficult to measure the current with high accuracy because the ratio of the current flowing through the main element to the current flowing through the auxiliary element varies depending on the current value.

On the other hand, the method of measuring the current by connecting the resistor to the main element in series can measure the current with high accuracy because all the current flowing through the main circuit flows through the resistor, but a large loss occurs in the resistor. Therefore, it is difficult to measure a current above several tens Amperes.

Furthermore, the method of measuring the current using the current transformer can measure the current with high accuracy, but it is difficult to make the system small in size and low in cost because the current transformer is large in size and high in price.

SUMMARY OF THE INVENTION

In order to solve the above problems, an object of the present invention is to provide an electric power converting system comprising a current detecting means with high accuracy.

An electric power converting system in accordance with the present invention comprises a switching element; an inductor connected to a main terminal of the switching element; and an integrating circuit for integrating voltage generated between both ends of the inductor.

When a current flowing through the switching element is switched on and off, a voltage in proportion to the current differentiation with respect to time is generated between the both ends of the inductor. The voltage generated in the inductor is integrated by the integrating circuit. A voltage in proportional to the current flowing through the switching element is generated in an output of the integrating circuit.

The detailed configuration of the electric power converting system in accordance with the present invention is as follows. A three-phase inverter is constructed by circuits, and in each of the circuits a small inductor capable of being practically formed by a wire is connected to a parallel circuit composed of the switching element and a diode connected to the switching element in inverse parallel. A driving circuit is connected to a gate of each of the switching circuits, and the integrating circuit is connected between terminals of the inductor. The driving circuit and the integrating circuit are connected to a host control unit through a communication interface. Detectors for detecting a rotating position and a rotating speed are attached to a motor. The host control unit adjusts a switching timing for each phase of the inverter based on a phase current obtained from an instantaneous current at on/off operation of the switching element. By doing so, the highly accurate motor control can be performed.

The other features of the present invention will clearly appear from the following description.

DESCRIPTION OF THE PREFERRED EMBODIMENTS

FIG. 1, FIG. 2, FIG. 3 and FIG. 4 are diagrams showing embodiments of a circuit of measuring a current of a switching element. FIG. 5 is a diagram showing a circuit measuring a current and a chart showing the measured result. The switching element is not necessary to be limited to an IGBT, but hereinafter the description will be made based on the IGBT.

Figure 1:
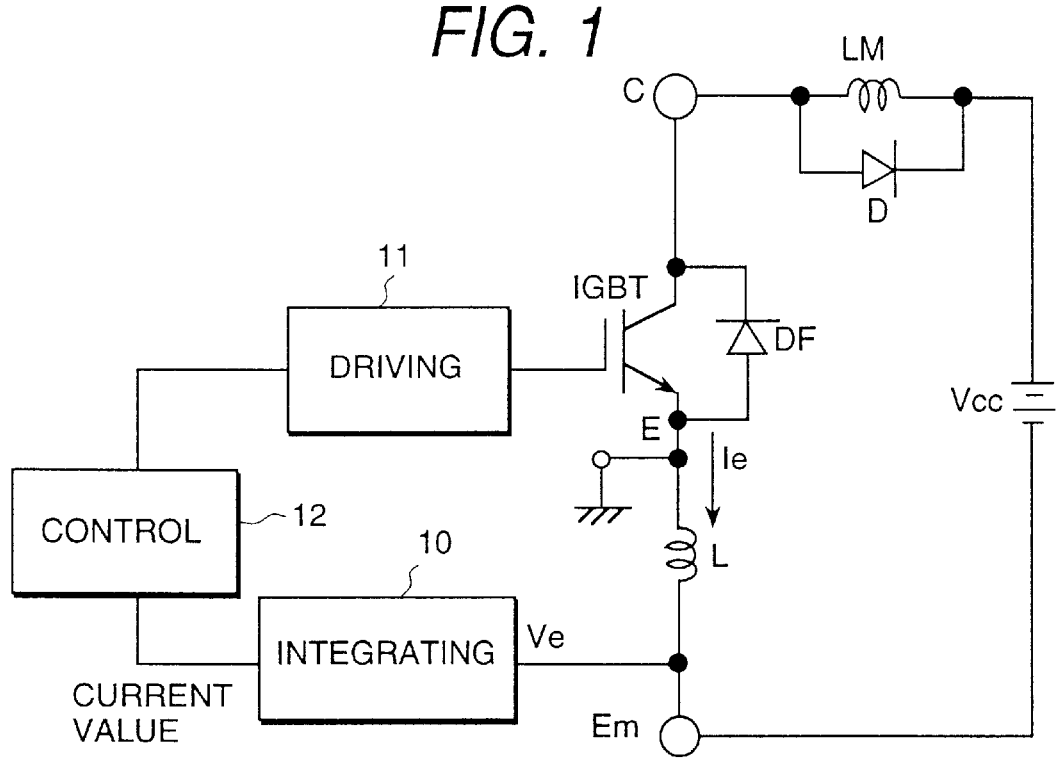
FIG. 1 is a diagram showing an embodiment of a circuit of measuring a current of a switching element in accordance with the present invention.

The configuration shown in FIG. 1 is as follows. An inductor L is connected to an emitter terminal of an IGBT in series. A driving circuit 11 is connected to a gate terminal G of the IGBT. The other terminal Em of the inductor is connected to an integrating circuit 10. The emitter terminal E is connected to the ground of the driving circuit 11 and the integrating circuit 10. The integrating circuit 10 integrates a voltage generated in the inductor L to output a value of current flowing through the inductor L. A control circuit 12 determines a control condition of the driving circuit 11 based on the information on current from the integrating circuit 10. A parallel circuit composed of an inductor LM and a diode D and a power supply Vcc are connected between the terminals C and Em in series. The IGBT supplies current to the inductor LM by being turned on/off by a signal from the driving circuit 11. The circuit shown by the circuit diagram of FIG. 1 is one component of an electric power converter shown in FIG. 10 or FIG. 12.

Figure 2:
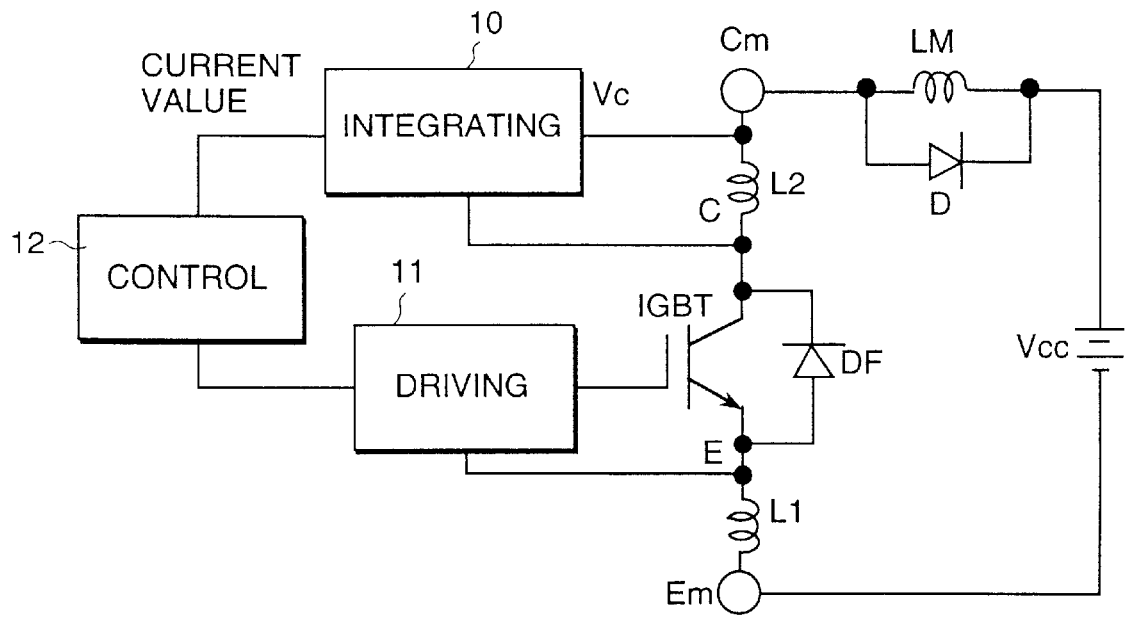
FIG. 2 is a circuit diagram showing another embodiment.

FIG. 2 shows another embodiment in which an inductor L2 is connected to the collector terminal C of the IGBT in series. The driving circuit 11 is connected to the gate terminal G of the IGBT. The other terminal Cm of the inductor is connected to the integrating circuit 10. The collector terminal C is connected to the ground of the integrating circuit 10, and the emitter terminal E is connected to the ground of the driving circuit 11. The integrating circuit 10 integrates a voltage generated in the inductor L2 to output a value of current flowing through the inductor L2. The control circuit 12 determines a control condition of the driving circuit 11 based on the information on current from the integrating circuit 10. Therein, the integrating circuit 10 and the driving circuit 11 are insulated from each other at a position between the integrating circuit 10 and the control circuit 12 or between the driving circuit 11 and the control circuit 12.

FIG. 3 is a perspective view showing an IGBT module and an equivalent circuit diagram of the IGBT module. An insulating plate 29 is placed on a heat-sink plate 211 made of a metal, and a metal plate 25 is placed thereon. On the meatal plate 25, an IGBT chip and a diode chip DF are arranged. Both of a collector electrode of the IGBT chip and a cathode electrode of the diode chip DF are connected to the collector terminal C through the metal plate 25. Further, both of an emitter electrode of the IGBT chip and an anode electrode of the diode chip DF are connected to the emitter terminal Em by a wire 28 through an emitter electrode plate 24. A sense emitter terminal Es is connected to an emitter terminal plate. The emitter terminal Em is a terminal for conducting the main current. On the other hand, the sense emitter terminal Es is a terminal used for conducting current for controlling the gate of the IGBT, and normally does not conduct the main current. The gate terminal G is connected to the gate electrode of the IBGT chip through a gate electrode plate 210. The configuration described above is contained in a plastic package 212, and each of the terminals is led out of the plastic package 212.

A main circuit formed by connecting a parallel circuit composed of an inductor LM and a diode D and a direct current power supply Vcc in sires is connected between the collector terminal C and the emitter terminal Em. The integrating circuit 10 is connected between the emitter terminal Em and the sense emitter terminal Es, and the driving circuit 11 is connected between the gate terminal G and the sense emitter terminal Es. Further, an output of the integrating circuit is transmitted to the control circuit, and an output of the control circuit is transmitted to the driving circuit.

Figure 3A:
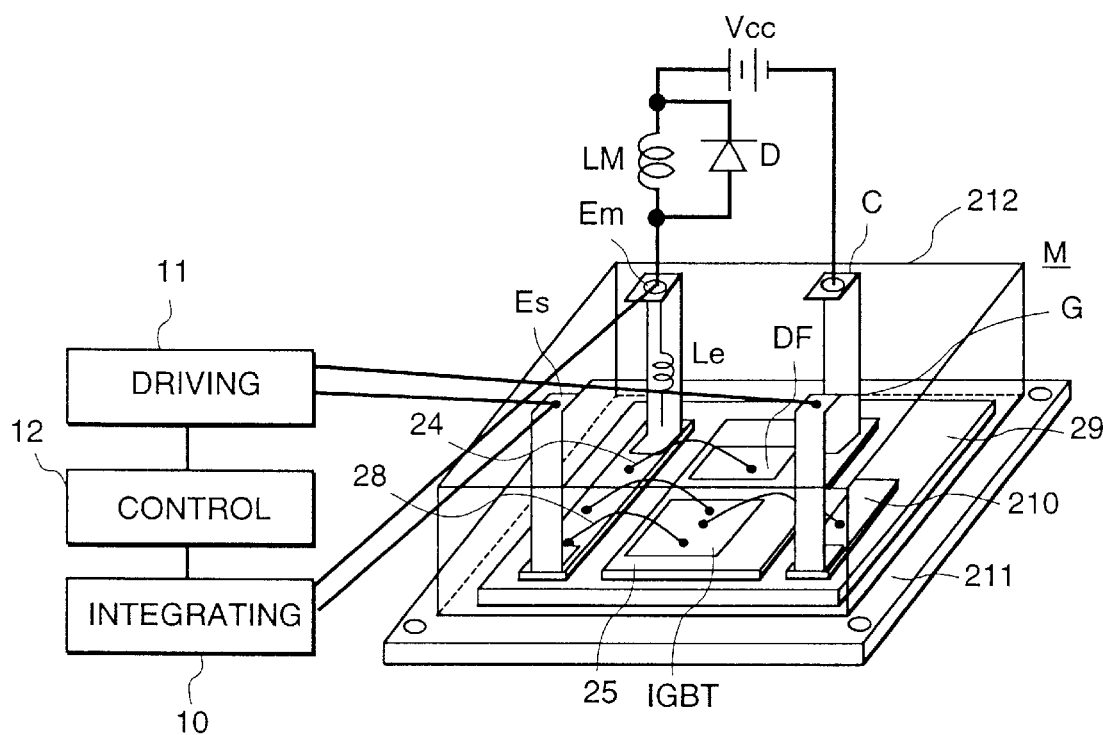
FIG. 3 is a perspective view showing an IGBT module and an equivalent circuit diagram of the IGBT module.
Figure 3B:
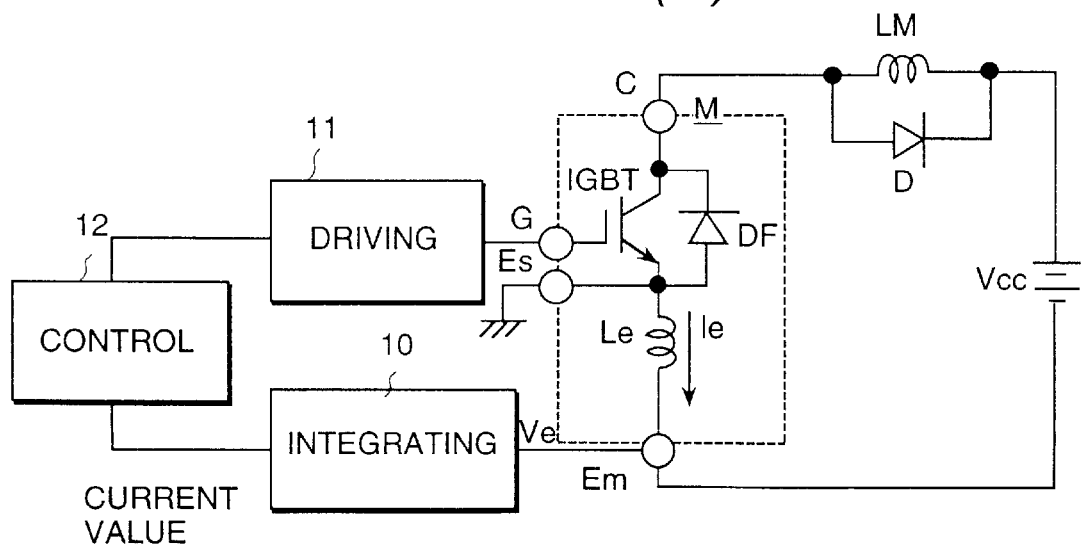

FIG. 3(B) shows the equivalent circuit of the IGBT module M. The IGBT and the diode DF are connected to each other in inverse parallel. The inverse parallel circuit is connected in series to the parasitic inductance Le possessed by the emitter electrode plate 24 and the emitter terminal Em shown in FIG. 3(A). The driving circuit 11 is connected to the gate terminal G, and the integrating circuit 10 is connected to the emitter terminal Em. The sense emitter terminal is connected to the ground of the driving circuit 11 and the integrating circuit 10. Therein, the sense emitter terminal Es is not always necessary to be connected to the ground terminal of the integrating circuit 10, but it may be possible that the emitter terminal Em is connected to the ground of the integrating circuit 10 and the sense emitter terminal Es is integrated as a signal. However, in this case, it is necessary to insulate the integrating circuit 10 and the driving circuit 11 from each other.

Figure 4A:
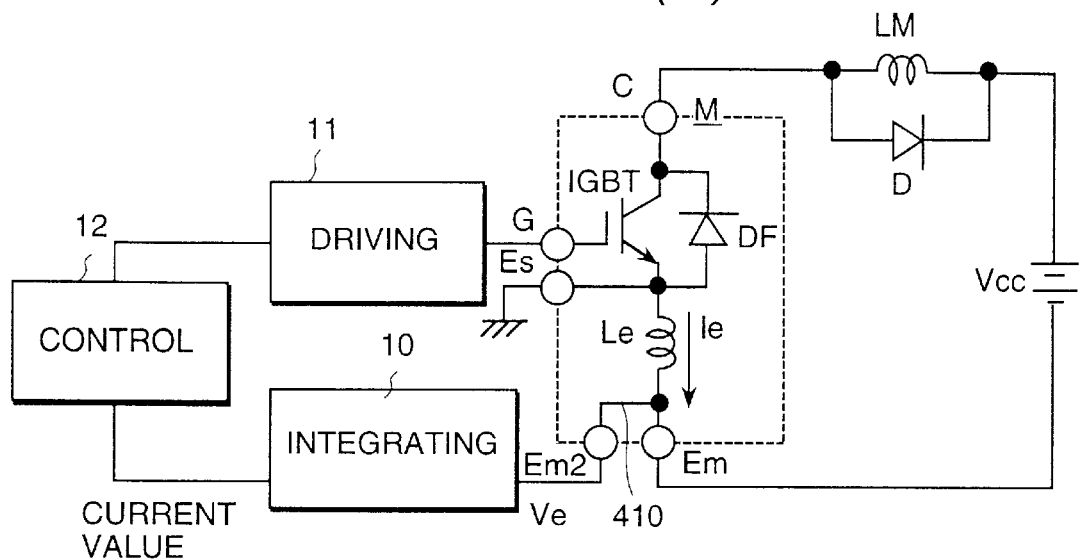
FIG. 4 is circuit diagrams showing other embodiments of methods of detecting current.

FIG. 4 shows further different embodiments. FIG. 4(A) shows an embodiment in which a terminal Em2 solely used for connecting to the integrating circuit is provided in the emitter side of the module M. In general, the terminal conducting the main current is necessary to be large in size and to be connected to the external main circuit using a large screw. On the other hand, a small screw can be used for the output terminal to the integrating circuit because it conducts a very small current. Therefore, it is difficult to connect both of the main circuit and the integrating circuit to one emitter terminal. The embodiment of FIG. 4(A) is modified from this viewpoint, and the terminal Em2 solely used for connecting to the integrating circuit is provided.

Figure 4B:
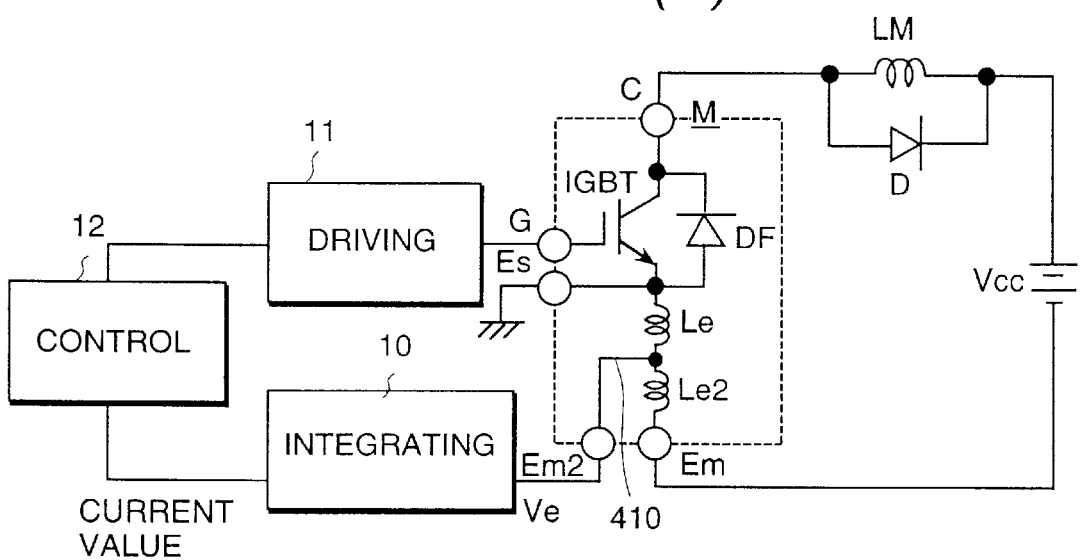

In the embodiment of FIG. 4(B), the inductor is divided into two parts, and a terminal solely used for the integrating circuit is led out from the middle of the inductor. It is preferable to make use of the parasitic inductance possessed by the emitter electrode plate 24 and the emitter terminal Em of the module M because number of the parts is not increased. However, since the parasitic inductance depends on the structure of the emitter electrode plate 24 and the emitter terminal Em, a magnitude of the parasitic inductance sometimes becomes large depending on the structure of the module. Since the voltage generated between the both ends of the inductor is in proportion to the value of the inductance, the voltage input to the integrating circuit is increased when the value of the inductance becomes large. Since the integrating circuit is generally designed so as to be operated with a power supply voltage of below ±20 V, there occurs the problem that when the input voltage to the integrating circuit is too high, the integrating circuit is broken by the high voltage. Therefore, by extracting the terminal for the integrating circuit from the middle portion between the emitter terminal plate 24 and the emitter electrode plate Em, the input voltage to the integrating circuit can be reduced to solve the above-mentioned problem.

Figure 5A:
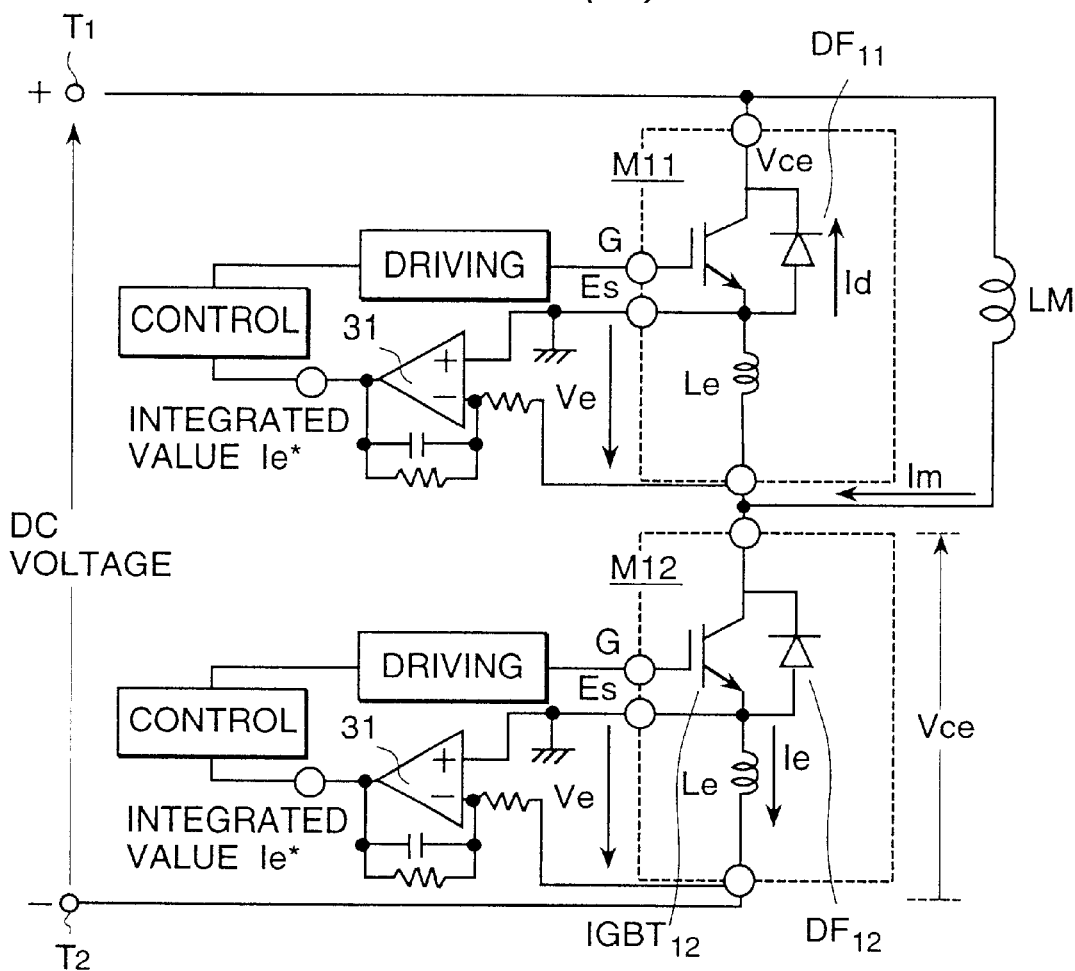
FIG. 5 is a diagram showing a circuit used for evaluation and a chart showing a measured result.

FIG. 5 is a diagram showing a circuit used for evaluation and a chart showing a measured result. The circuit used for evaluation of FIG. 5(A) is constructed by connection two of the circuits shown by FIG. 3(B) in series, and the main terminals of the series circuit are connected to terminals T1 and T2 of the direct current power supply. Further, an inductor LM is connected between the main terminals of the module M11. An operational amplifier 31 and a resistor and a capacitor connected to the operational amplifier 31 composing an integrating circuit. The details of the integrating circuit are to be described in FIG. 6. The present circuit of FIG. 5(A) corresponds to one phase part of the three-phase inverter shown in FIG. 10 or FIG. 12.

Figure 5B:
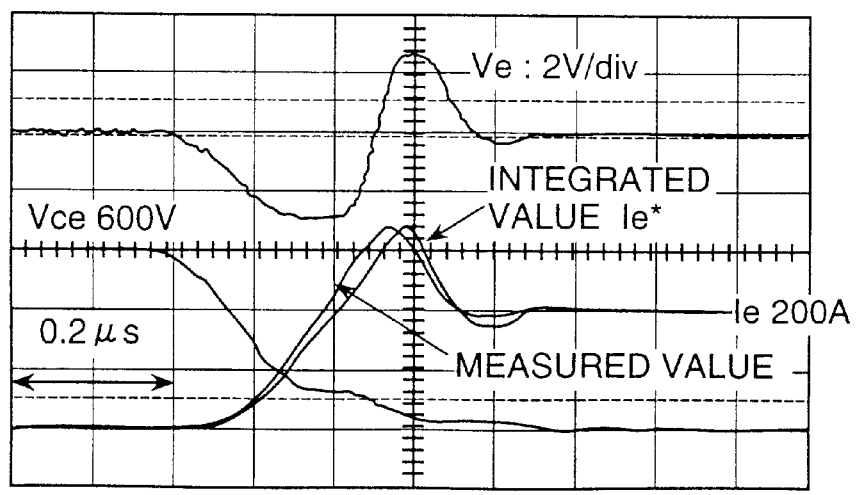

FIG. 5(B) shows waveforms in the module M12 side when the $IGBT_{12}$ of the module M12 is turned on. The waveform Ve is a voltage generated in the inductor Le on the basis of the sense emitter terminal Es. The waveform Vcc is a voltage of the collector terminal. In regard to current, a waveform of the current flowing through the emitter wire portion measured by a current transformer and a waveform Ie* obtained by integrating. The voltage Ve generated in the reactor Le are shown. The both agree well with each other. Therefore, it can be understood that the current can be measure by integrating the voltage Ve generated in the reactor Le.

The measurement was performed as follows. The gate G of the $IGBT_{12}$ is set to a high voltage to bring the $IGBT_{12}$ in the ON state. Then, current flows through the inductor LM, the $IGBT_{12}$ and the inductor Le. Since the value of the inductance LM is large, most of the direct current voltage is applied to the inductor LM. Therefore, the current is increased in proportion to time. Next, at the time when the current reaches 200 A, the gate signal of the $IGBT_{12}$ is reduced to a low voltage to bring the $IGBT_{12}$ to the OFF state to turned off the current. Then, the current flowing through the inductor LM is commutated to the diode $DF_{11}$ side. When the $IGBT_{12}$ is turned on again at the time several tens μs after, the current flowing through the inductor LM is transferred from the diode $DF_{11}$ to the $IGBT_{12}$. Therefore, a voltage Ve in proportion to a changing rate of the current is generated in the inductor Le. The waveforms of FIG. 5(B) are waveforms when the $IGBT_{12}$ is turned on.

When the $IGBT_{12}$ is turned on, a current larger than a current flowing through the inductor LM flows for several hundreds ns. The reason is as follows. When current is conducted in the diode $DF_{11}$ in the normal direction, carriers are accumulated inside the diode $DF_{11}$. Therefore, when the $IGBT_{12}$ is turned on to apply an inverse direction voltage to the diode $DF_{11}$, current flows in the diode $DF_{11}$ in the inverse direction due to the carriers accumulated inside the diode. This current is called as recovery current of a diode. Since the current at turning-on the $IGBT_{12}$ becomes the sum of the recovery current of the diode $DF_{11}$ and the current flowing through the inductor LM, the current larger than the current flowing through the inductor LM flows during the initial period of turning-on. Consequently, in a case where a current flowing through the inductor LM is intended to be measured, it is necessary to read a current value after disappearing of the recovery current of the diode. A time period of flowing the recovery current of a diode is generally several tens to several hundreds ns for a diode having a withstanding voltage below 100 V, approximately 1 μs for a diode having a withstanding voltage below 1000 V, and 3 to 4 μs for a diode having a withstanding voltage of several thousands V.

Figure 6A:
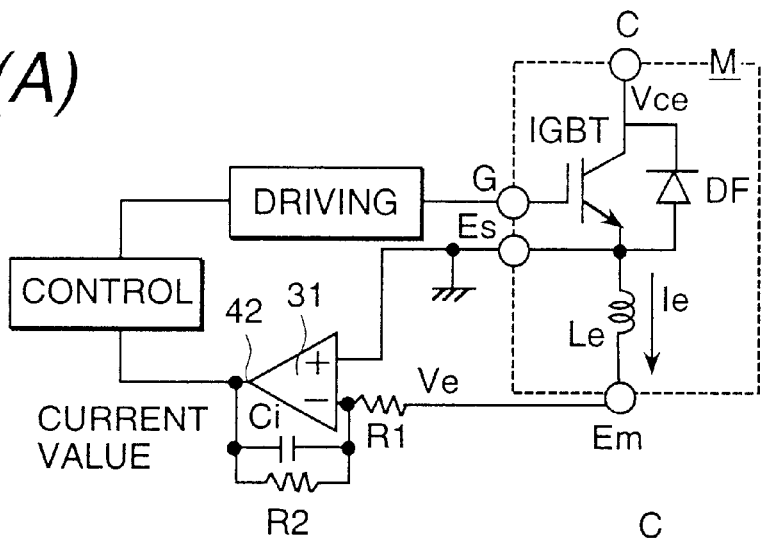
FIG. 6 is block diagrams showing other embodiments of integrating circuits.

FIG. 6 is block diagrams showing other embodiments of integrating circuits. In the embodiment of FIG. 6(A), the emitter terminal Em is connected to the negative side terminal of the operational amplifier 31 through a resistor R1. The positive side terminal of the operational amplifier 31 is connected to the sense emitter terminal Es. Further, a capacitor Ci and a resistor R2 are connected between the negative side terminal of the operational amplifier 31 and the output terminal 42 of the operational amplifier. The operational amplifier 31, the resistor R1 and the capacitor Ci compose an integrating circuit for integrating the output voltage Ve from the emitter terminal. The resistor R2 is a resistor for preventing an integration error of the operational amplifier 31, and generally has a resistance of 100 kΩ to several MΩ. The integration error is generated by integrating a voltage generated in the resistor R1 by the bias current flowing between the positive terminal and the negative terminal of the operational amplifier 31.

The configuration of FIG. 6(A) inserting the resistor R2 functions as a high-pass filter which low-frequency signal components are not allowed to pass through. The cut-off frequency is $1/(2\pi \ Ci \cdot R2)$, and signals having frequencies lower than that value are not allowed to pass through the integrating circuit. Therefore, in order to make the integrating circuit operable as an integrator down to a low frequency signal, the values Ci and R2 need to be larger.

Figure 6B:
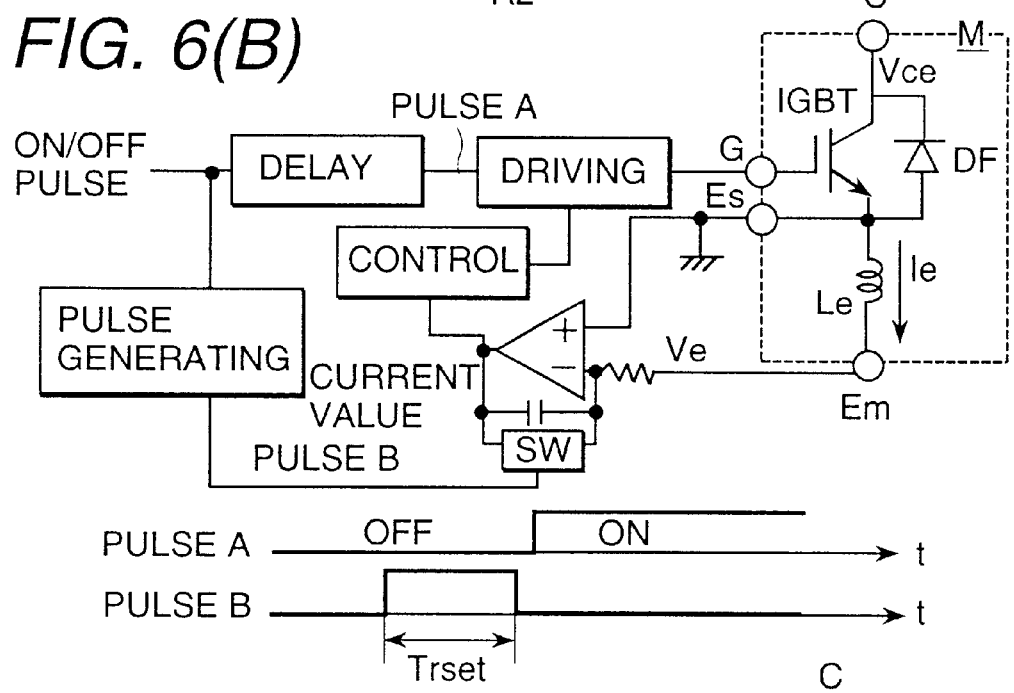

The embodiment of FIG. 6(B) is an example of a circuit operable as an integrator down to a low frequency signal, and the resistor R2 of FIG. 6(A) is replaced by a switch SW. As the switch SW, it is preferable to use an analogue switch of which the resistance is small at the ON state and large at the OFF state. The switch SW is used for resetting the integrating circuit by discharging the capacitor Ci. A narrow-width pulse is formed from an on-off pulse for switching the IGBT. When the narrow-width pulse is input to the switch SW to bring the switch SW in the ON state, the charge in the capacitor Ci is discharged and the output of the integrating circuit becomes 0 V. Since the gate signal of the IGBT is delayed by a delay circuit, the IGBT starts switching operation with a delay after reset time of the integrating circuit. At the time of turn-on operation, the IGBT is turned on under a condition of 0 V output because the integrating circuit has been reset before current flows in the IGBT. Therefore, the current flowing through the IGBT can be accurately measured. Similarly, at the time of turn-off operation, the output of the integrating circuit becomes 0 V in prior to the turn-off operation of the IGBT though the voltage from the integrating circuit is reversed. Therefore, the current flowing through the IGBT can be accurately measured. Therein, the analogue switch is formed using a MOSFET, and the resistance is generally as small as several tens Ω during the ON state and is as large as several tens MΩ to hundred MΩ during the OFF state. Therefore, the cut-off frequency of the integrating circuit during the analogue switch being in the OFF state is lower than that of the method of FIG. 6(A) by 2 to 3 orders, and accordingly lower frequency currents can be measured. Further, the reset time is determined by a through-rate (a speed capable of changing the output voltage) of the operational amplifier and an output voltage before resetting. In an operational amplifier commonly used. The through-rate is approximately 10 V/μs. Therefore, when the output voltage is designed to be set to, for example, about ±15 V, it is acceptable to set the reset period $T_{rset}$ to 1.5 μs. The time relationship between these pulses is also shown in FIG. 6(B).

Figure 6C:
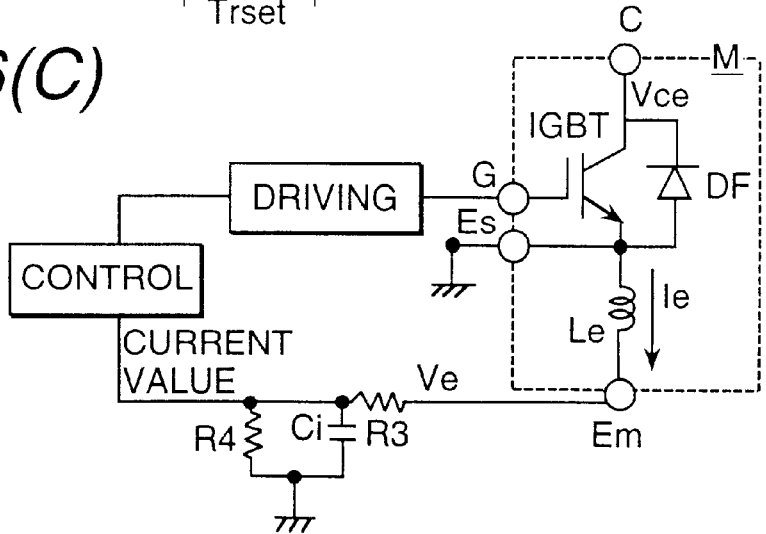

FIG. 6(C) shows another embodiment in which the integrating circuit is constructed using passive parts. The integrating circuit is composed of a resistor R3 and a capacitor Ci. The circuit has an advantage in that the integrating circuit can be constructed only the capacitor and the resistor, and accordingly number of the parts is small. Similarly to the embodiment of FIG. 6(B), it is possible that a switch SW is connected to the capacitor Ci in parallel, and the integrating circuit is reset by turning on the switch SW in prior to switching the IGBT.

Figure 7A:
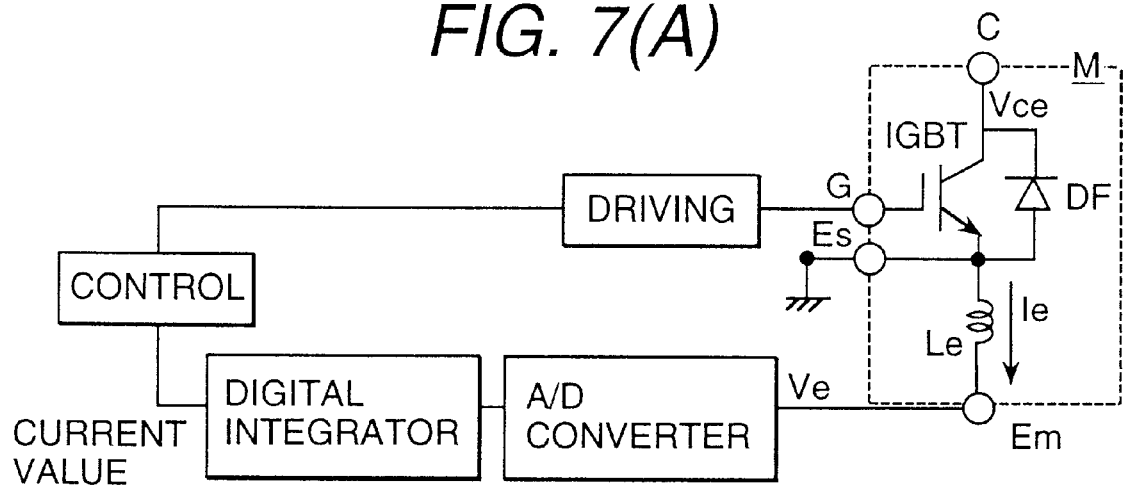
FIG. 7 is block diagrams showing other embodiments in which the signal is digitally processed.

FIG. 7(A) is a block diagrams showing a further embodiment in which the signal is digitally processed. After converting the voltage Ve of the inductor Le from an analogue signal to a digital signal, the digital signal is digitally processed to obtain a current value. Detailed description on the method of digital integration is omitted here because the prior art may be employed for it. In the method of digital integration, current measurement with a less error can be performed by starting integration after clearing the integrated value in prior to switching the IGBT.

Figure 7B:
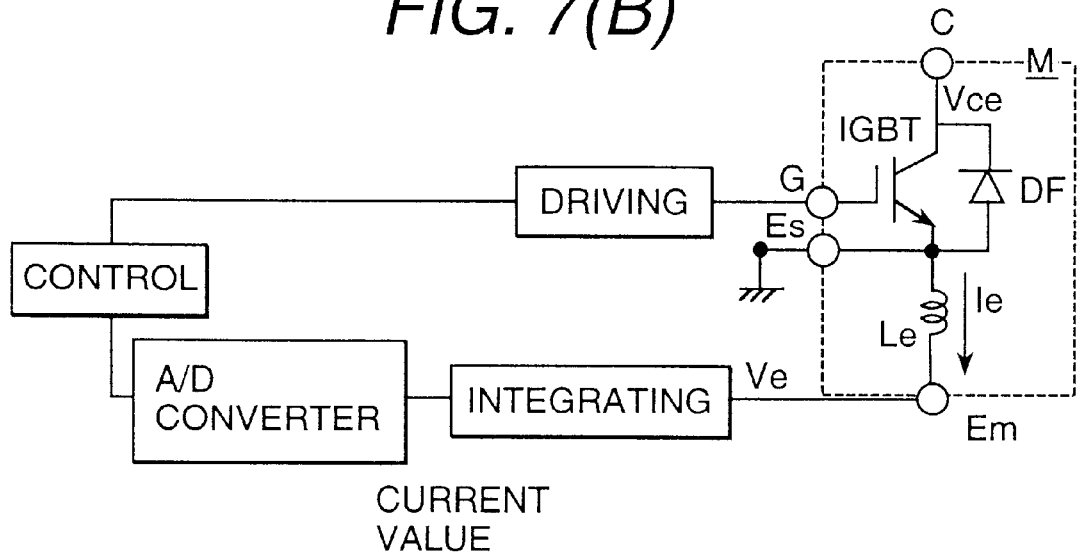

The configuration of FIG. 7(A) has an advantage in that integration with a less error can be performed because the voltage of the inductor is directly converted into a digital signal and then integrated. However, it is obvious from the measured result of FIG. 5(B) that the voltage generated in the inductor usually has signal components of several tens MHz, and accordingly the A/D converter needs to be operated with at least several tens MHz in order to integrate the voltage. Although such an A/D converter can be constructed using a technology at the present time, the cost of the A/D converter becomes high if the driving frequency is increased. The embodiment of FIG. 7(B) is capable of solving the problem. An analogue signal of the voltage generated in the inductor is integrated and then converted to a digital signal. As described in FIG. 5(B), the current of the IGBT can be obtained by reading a current at the time several μs after switching of the IGBT. In general, in a case of an electric converter using an IGBT, the switching frequency of the IGBT is several kHz to several tens kHz, and the operating frequency of the A/D converter is also in the same range. Therefore, an economical A/D converter can be used.

Figure 8A:
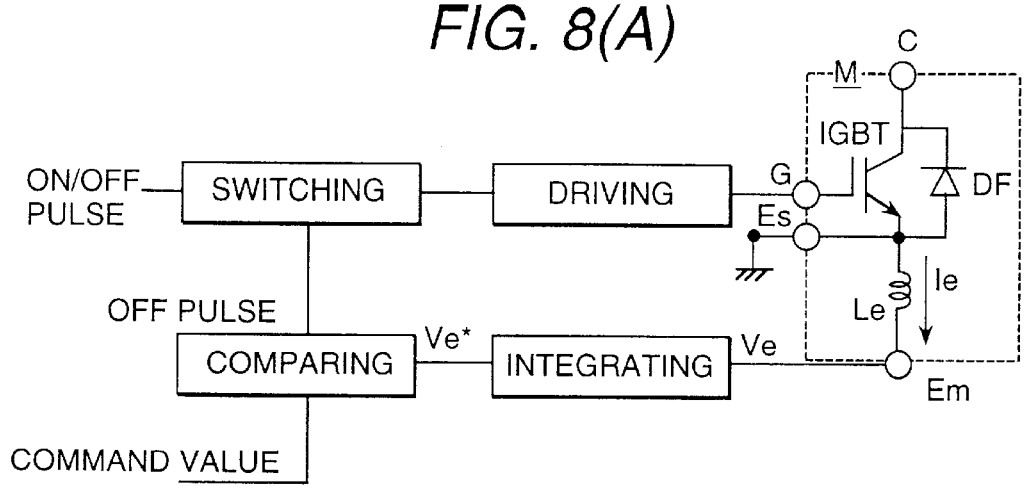
FIG. 8 is a block diagram and a detailed circuit diagram showing a short-circuit protective circuit.
Figure 8B:
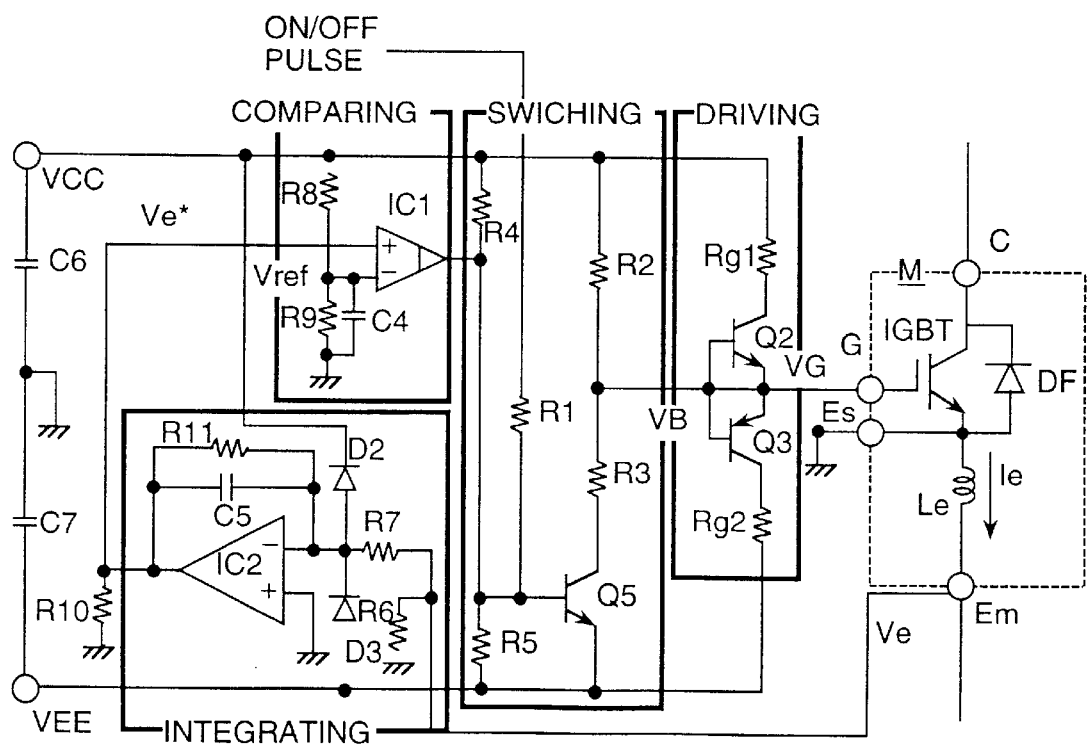

FIG. 8 is a block diagram and a detailed circuit diagram showing a short-circuit protective circuit. An output from the integrating circuit is compared with a command value by a comparing circuit. When the current exceeds the command value, the comparing circuit outputs the OFF pulse, and a switching circuit outputs an OFF pulse to the driving circuit. The driving circuit decreases the gate voltage of the IGBT to turn off the IGBT. The short-circuit protection is performed through the path described above. Description will be made on protective operation when a short-circuit occurs in the IGBT, referring to the detailed circuit diagram of FIG. 8(B).

When the ON-OFF pulse is set to a high voltage, a transistor Q2 is turned on and a transistor Q3 is turned off because the base voltage VB of the transistors Q2 and Q3 becomes a high voltage. Thereby, the gate voltage of the IGBT is increased and the IGBT becomes in the ON state to allow current to flow between the collector terminal C and the emitter terminal Em. As the current flows through the IGBT, a voltage Ve in proportion to a changing rate of the current di/dt of the IGBT is generated in the inductor Le. Therefore, the integrating circuit composed of an operational amplifier IC2 outputs the current of the IGBT as a voltage Ve'. The voltage Ve' obtained through integration is transmitted to the comparing circuit composed of a comparator IC1 to be compared with a voltage command value Vref determined by a power supply voltage, a resistor R8 and a resistor R9. When an integrated value Ve* of the current becomes a value larger than the command value Vref, the output of the comparator becomes a high voltage state to turn on a transistor Q5. Thereby, the transistor Q2 Is turned off and the transistor Q3 is turned on because the base voltage VB of the transistors Q2 and Q3 is lowered, and the gate voltage VG of the IGBT is lowered to bring the IGBT in the OFF state. In other words, when a current larger than the voltage command value Vref flows in the IGBT, the IGBT is brought into the cut-off state irrespective of the command of the ON-OFF pulse.

Figure 10:
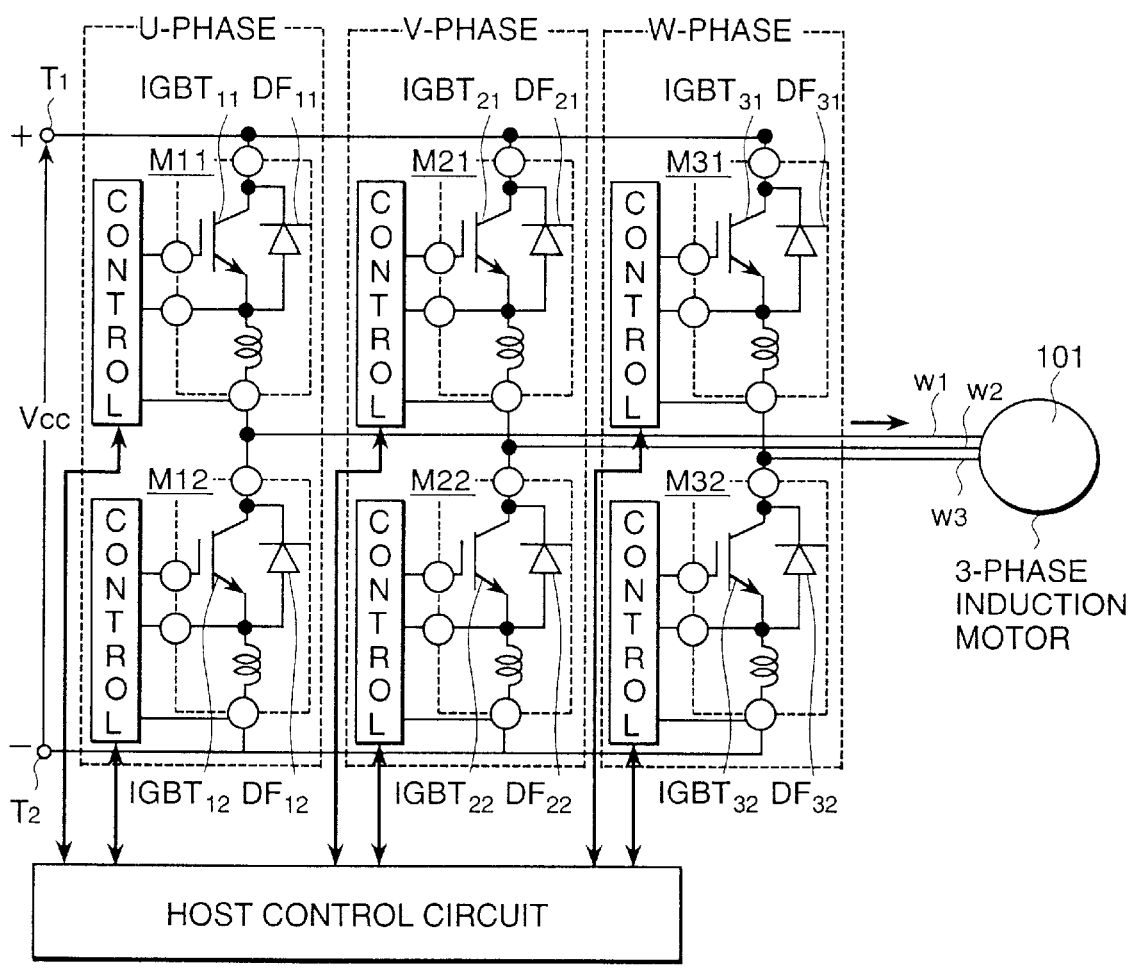
FIG. 10 is a block diagram showing a three-phase inverter.

In the case of short-circuit protection, the integration condition may be determined as follows. When a short-circuit occurs, the current of the IGBT rapidly increases. The increasing rate of the current is determined by the power supply voltage, the inductance of the main circuit and the turn-on speed of the IGBT. The inductance of the main circuit, for example, the U-phase circuit oil FIG. 10 is inductance possessed by the loop composed of a terminal Ti, a module M11, a module M12, a terminal T2 and a power supply. In a case of an IGBT inverter, since the inductance of the main circuit is generally as small as 0.1 μH to 1 μH, the increasing speed of current di/dt at short-circuit is as fast as several hundreds A/μs to several thousands A/μs. Therefore, the frequency components at that case are as high frequencies as several hundreds kHz to several thousands kHz. From these relationships, in the case of short-circuit protection by integrating the current at short-circuit, the cut-off frequency of the integrating circuit can be set from 10 kHz to 100 kHz in taking a margin of one order.

Further, the output of the comparator IC1 may be input to a latch circuit to maintain the OFF state, though it is not shown in FIG. 8. Causes of occurrence of a short-circuit considered are various examples such as an erroneous operation due to a nose, an erroneous control and so on. In the case of the former case, since the short-circuit is not considered to occur successively, the IGBT is turned off when the current exceeds a preset value, and then may be returned to the normal operation by releasing the protection when the current becomes below the preset value. On the other hand, in the latter case, since the cause of producing the short-circuit continues for a long period, it is preferable that the IGBT is turned off, and at the same time information of the occurrence of short-circuit is transmitted to the host control unit and the OFF state is maintained until a release command is received. Since various methods of coping with a short-circuit can be considered, an appropriate method may be employed depending on the purpose of the system.

Since an IGBT is fast in switching, a rapid voltage change (dv/dt) occurs. When the value is large, not only a switching nose is generated, but also an over current is generated between the terminals of a motor to cause a damage in the motor. Therefore, reducing of the voltage change (dv/dt) is proposed, for example, in Japanese Patent Application Laid-Open No. 10-150764. An object of an embodiment of FIG. 9 is to suppress the voltage change dV/dt. When the voltage change dv/dt of the IGBT is reduced, the switching loss is increased. This is because rising and falling of the voltage become moderate to increase the product of the current and the voltage. Therefore, it is not preferable to decrease the voltage change dv/dt unnecessarily too small.

Figure 9A:
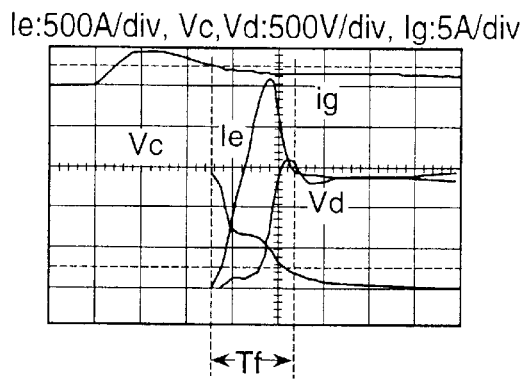
FIG. 9 is graphs and a block diagram showing an embodiment for suppressing dV/dt.
Figure 9B:
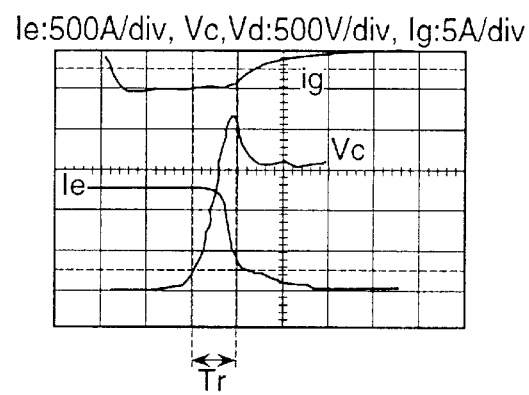
Figure 9C:
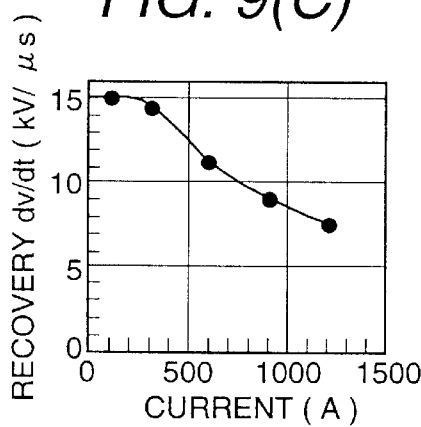
Figure 9D:
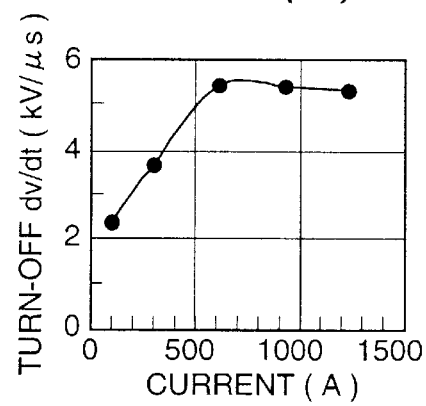

FIG. 9(A) shows a switching waveform at turning-on of the IGBT, and (B) shows a switching waveform at turning-off. The reference character Ig indicates the gate current, the reference character Ie indicates the emitter current, the reference character Vc indicates the collector voltage, and the reference character Vd indicates the voltage of the diode in the other module (the diode in the other module out of the IGBT modules connected to each other in series). The IGBT modules used in this measurement are of 3.3 kV withstanding voltage and 1200 A rated current. Since the voltage change dv/dt generated by recovery is much larger than the voltage change dv/dt generated at turning-on of the IGBT, the recovery dv/dt is taken on the ordinate in the graph of FIG. 9(C).

It was found that the voltage change dv/dt of the IGBT could be reduced by decreasing the gate current of the IGBT during the period when the voltage is being changed. The period when the voltage is being changed means the period shown by the reference character Tf for the turning-on operation, and the period shown by the reference character Tr for the turning-off operation. Further, it was found from a study on current dependence of dv/dt under a constant gate control condition that the recovery dv/dt decreased as the current was increased. On the other hand, it was also found that the voltage change dv/dt at turning-off increased as the current was increased up to approximately 600 A. and became constant above 600 A. Therefore, it can be understood that during the period of turning-on, the switching loss of the IGBT due to excessive suppressing of dv/dt at a large current can be prevented by driving the IGBT by decreasing the gate current Ig when the current is small and increasing the gate current Ig when the current is large. During the period of turning-off, vice versa.

Figure 9E:
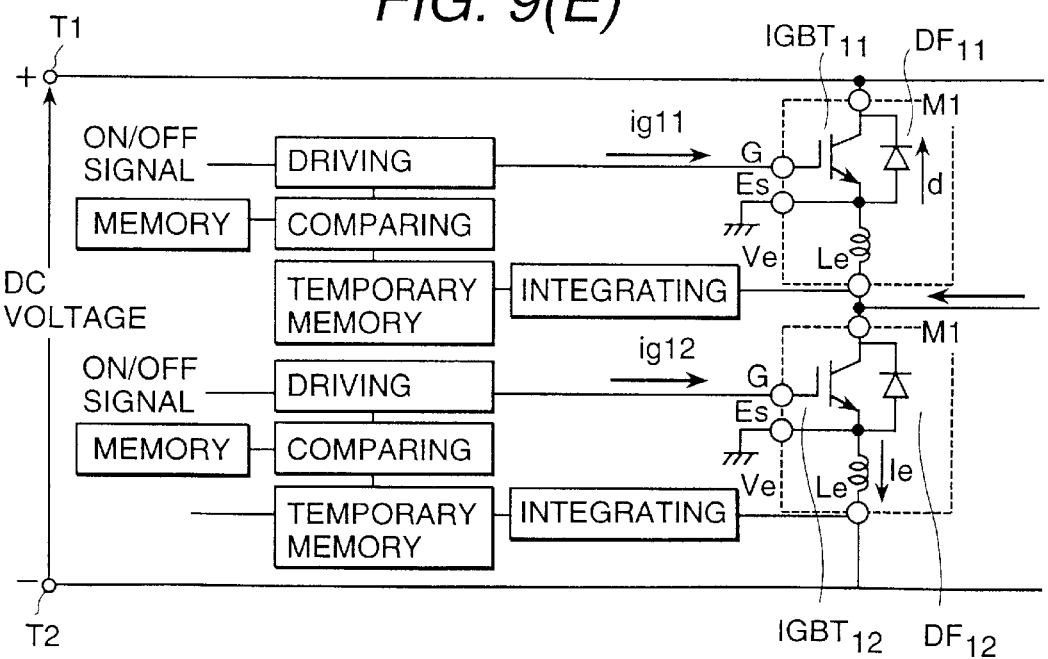

FIG. 9(E) is a block diagram showing the circuit for controlling the voltage change dv/dt constant, and the circuit diagram illustrates one phase part out of a three-phase inverter. The voltage Ve of the inductor Le is integrated, and the current after disappearing of the recovery current is read and temporarily stored. Then, the voltage change dv/dt and the loss are minimized by controlling the current Ig supplied to the gate of the IGBT from the driving circuit corresponding to the stored value. In order to control the voltage change dv/dt corresponding to the current value of the IGBT, it is preferable that the gate current Ig is controlled simultaneously with reading of the current. However, it is impossible because the reading of the current can not be performed until the IGBT is switched. This problem is solved by making use of the fact that the switching frequency of the electric power converting system is higher than the frequency of load current of the electric power converting system by 1 to 3 orders. In the control at turning-on, the gate current Ig at turning-on is determined using a current value measured at turning-off just before. The difference is not so large if the current measured at last turning-on. On the other hand, the gate current Ig at turning-off is similarly determined using a current value measured at turning-on just before. By doing so, the voltage change dv/dt can be controlled constant without high speed judgment.

Further, the current change di/dt at switching can be also controlled by the gate current at switching. In that case, the current change di/dt is controlled by the method similar to that for controlling the voltage change.

A method of obtaining phase current will be described below. In general, load currents are measured in an electric power converting system. For example, in vector control for efficiently rotating an induction motor, measurement of motor currents is necessary.

FIG. 10 is a block diagram showing a three-phase inverter for controlling a three-phase induction motor. A control circuit is connected to a gate terminal G, a sense emitter terminal Es and an emitter terminal Em of a module M11. The control circuit shown here means a circuit composed of the integrating circuit 10, the driving circuit 11 and the control circuit 12, if taking the configuration of FIG. 1 as an example. The two circuits each composed of the module and the control circuit are connected to each other in series to compose one phase part of the three-phase inverter. Further, three of the one-phase parts are connected to one another to form the three-phase inverter. Hereinafter, the modules M11, M21, M31 are called as upper arm modules, and the modules M12, M22, M32 are called as lower arm modules. The collector terminals of the upper modules are connected to a positive terminal T1 of a direct current voltage Vcc, and the emitter terminals of the upper modules are connected to a negative terminal T2 of the direct current voltage Vcc. Each junction point of the upper module and the lower module is connected to the three-phase induction motor. Further, each of the control circuits is connected to a host control circuit to perform PWM control of the three-phase inverter.

Figure 11A:
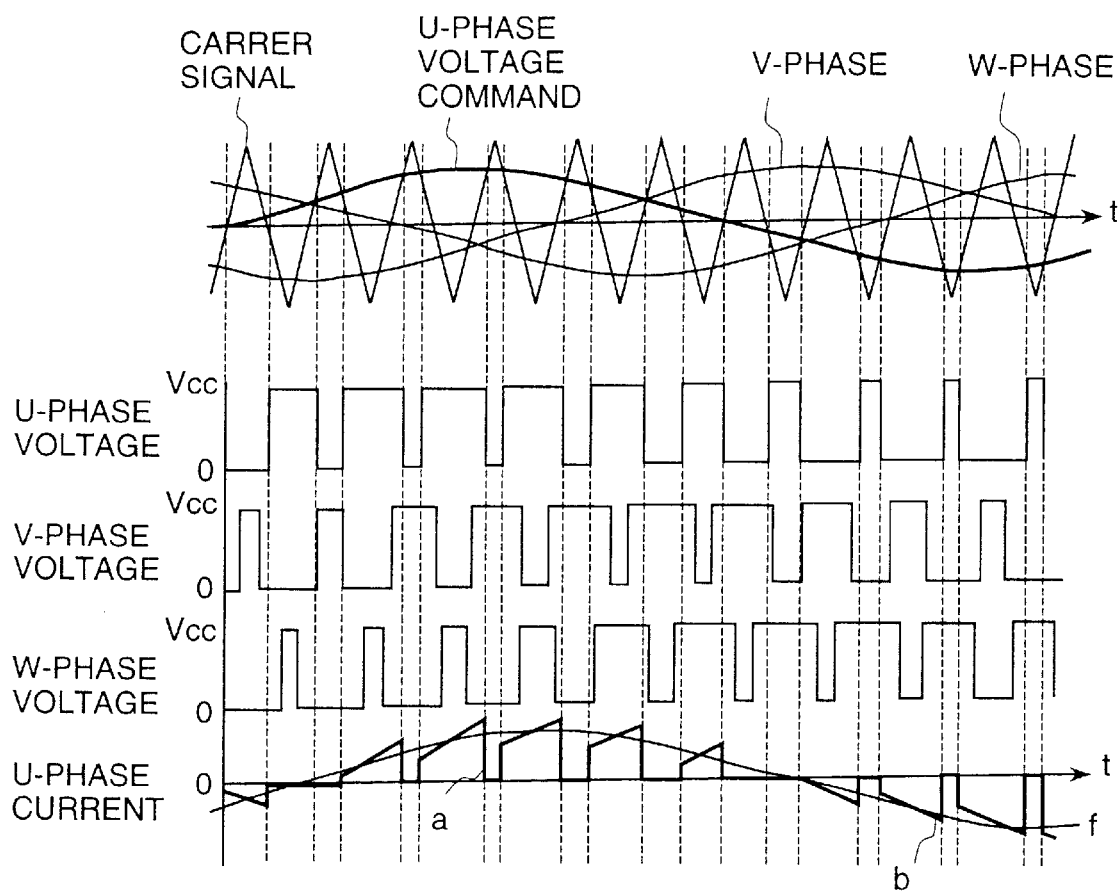
FIG. 11 is charts explaining a method of obtaining phase currents.

FIG. 11 is charts explaining a method of obtaining phase currents. A switching command for each phase is determined from a carrier signal and a voltage command for each phase. For example, explaining by taking the U-phase as an example, the $IGBT_{11}$ is in the ON state and the $IGBT_{12}$ is in the OFF state when the voltage of the U-phase is Vcc, and on the contrary, the $IGBT_{11}$ is in the OFF state and the $IGBT_{12}$ is in the ON state when the voltage of the U-phase is 0 V. Therein, a period to turn off the both IGBTs is provided at actually switching the $IGBT_{11}$ and the $IGBT_{12}$ to preventing occurrence of short-circuit between the direct current terminals.

Figure 11B:
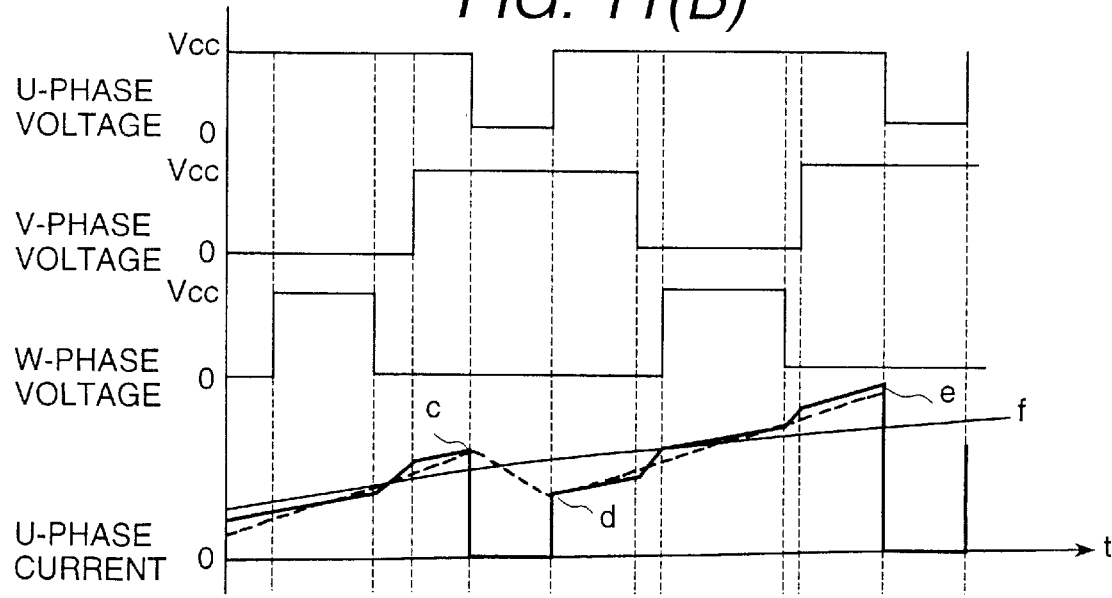

The current flowing through the load is increased when the phase voltage is Vcc, and decreased when the phase voltage is 0 V. When the U-phase current of the induction motor is positive, a waveform shown by the reference character a is observed in the module M11. On the other hand, when the U-phase current of the induction motor is negative, a waveform shown by the reference character b is observed in the module M12 side. FIG. 11(B) is an enlarged chart showing a part of the observed waveform in which the point d indicates the time when the $IGBT_{11}$ is turned on, and the points c and e indicate the time when the $IGBT_{11}$ is turned off. During the period from the point c to the point d, the IGBT$_{11}$ is in the OFF state and the U-phase current flows through the diode DF$_{12}$. During the period, the current is decreased because current is not supplied from the direct current supply. During the period from the point d to the point e, the IGBT$_{11}$ is in the ON state and the current is increased because current is supplied from the direct current supply Vcc through the IGBT$_{11}$. The current of the IGBT$_{11}$ flows to the wires W2 and W3 through the wire W1. Therefore, the changing rate of current becomes larger when both of the IGBT$_{22}$ and the IGBT$_{32}$ are in the ON state than when either of the IGBT$_{22}$ and the IGBT$_{32}$ is in the ON state. FIG. 11(B) shows this feature, and the gradient of current increase becomes steeper when both of the IGBTs are in the ON state. Therein, the reference character f indicates the average value of the current.

The switching elements of the electric power converting system supply current and voltage from the power supply to the load by switching operation. The current flowing through the switching element rapidly changes at switching, but the current change in the interval between switching and switching is small because the inductance of the motor is usually as large as several mH. In general, while the current changing rate di/dt at switching is several hundreds A/$\mu$s to several thousands A/$\mu$s, the current changing rate in the interval between switching and switching is several hundreds mA/$\mu$s which is approximately 1/10000 of the current changing rate at switching. In an inverter system, the inductance of the emitter wiring portion is generally designed to be as small as several nH because the inductance in the main circuit wiring is required to be as small as possible in order to prevent an over-current at switching. Therefore, since the voltage generated in the inductors of the emitter wiring in the interval between switching and switching is as small as several hundreds $\mu$V, it is difficult to measure the voltage with high accuracy using a low-cost integrating circuit.

However, since the inductance of the motor is as large as several mH, the current in the interval between switching and switching can be obtained by making use of the fact that the current flowing inti the motor changes linearly. For example, the current flowing inti the motor is obtained by measuring currents just after turning-on and turning-off of the IGBT and interpolating by connecting between the currents with a straight line. Even in this method, there is a little error, as obvious from FIG. 11(B). As described above, the phase current flowing into the motor (current flowing through the input wire of the motor) can be obtained by integrating the voltage generated in the emitter inductance and just after that reading the current, and connecting between the both with a straight line. It can be easily understood that when the phase current is negative, the phase current can be obtained by performing the similar processing to the IGBT$_{12}$. Therefore, explanation on this case is omitted.

The value of emitter inductance of the IGBT module is slightly different depending on each module, and the value of inductance is sometimes changed depending on each module due to mutual induction by wiring members between the modules when the module is mounted to form an inverter. One method of solving the problem is that in a circuit, for example, of FIG. 10, integration constants of the integrators in the individual control circuits are adjusted by performing switching operation, measuring a current flowing through the emitter inductance using a current transformer, and obtaining an inductance value from a voltage generated in the both terminals. However, this method requires a lot of time and labor, and accordingly not a practical method. The trouble can be solved by redesigning the control circuit of FIG. 10 so that the integration constants of the integrators in the individual control circuits are automatically changeable, conducting a current of known value to the IGBT to automatically change the integration constant so that the read value of the integrator becomes equal to the known value of current. The method of flowing the current of known value can be realized by connecting a three-phase load instead of the three-phase motor and performing switching operation. For example, by bringing the IGBT$_{22}$ in the ON state and switching the IGBT$_{11}$, a current of known value can be conducted through the IGBT$_{11}$ because a current flowing through the IGBT$_{11}$ is determined by the load resistance and the voltage of the direct current power supply. The method of automatically changing an integration constant can be realized by A/D converting an output of the integrating circuit and performing correction through digital processing if the control circuit of FIG. 10 has the configuration shown in FIG. 6 or FIG. 7. Since it is obvious that the correction can be performed through the digital processing method, detailed description on the method will be omitted here.

As a method of conducting a current of known value, a three-phase induction load may be connected to the electric power converting system. In this case, since current increases in proportion to time, the current of known value can be determined by a voltage of the power supply, a value of inductance and a conducting time. Further, a current transformed is inserted in the wire of the load, and the integration constant may be automatically adjusted so that the read value agrees with the output value of the integrator by directly comparing the both values.

In vector control of a motor for performing smooth starting or stopping by controlling torque of the motor in an optimum condition, an average value of current flowing through the motor is used. As described above, when the motor is controlled using the inverter, current having a ripple (fluctuation of current) component caused by switching operation of the IGBT flows through the motor. Therefore, in the vector control, current is generally read at a peak portion of the carrier signal. The reason is that the peak point of the carrier signal is the middle time point of an interval between switching and switching, and that the value of current at the middle time point of an interval between switching and switching is an average value of the current flowing through the motor. Therefore, by measuring a current at every switching time and calculating a current at the middle time of the measurement points, an average current used for the vector control can be obtained. In a case where an average current over all the time period, the average current can be obtained by connecting between every measured points with a straight line, and averaging with respect to time these values as current values at individual time points.

Figure 12:
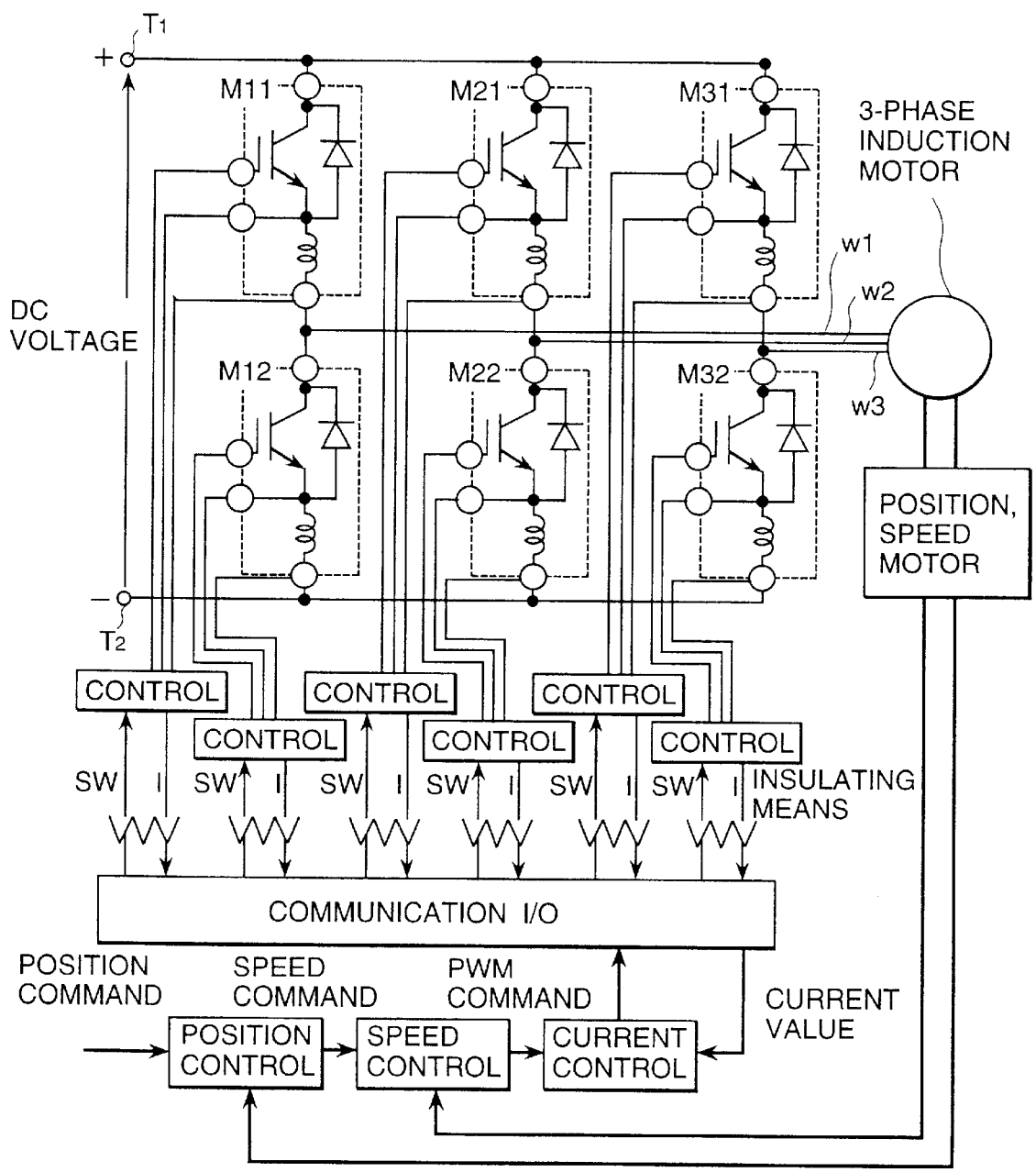
FIG. 12 is a block diagram showing an inverter having a vector control function.

FIG. 12 is a block diagram showing an inverter having a vector control function. The control circuit is connected to the gate terminal G, the sense emitter terminal Es and the emitter terminal Em of each IGBT. A communication I/O is placed in the higher level of each of the control circuits, and switching information SW is transmitted from the communication I/O to each of the control circuits, and current information I is transmitted from each of the control circuits to the communication I/O. The communication I/O is electrically insulated from each of the control circuits. A current controller, a speed controller and a position controller are placed in the higher level of the communication I/O. A PWM command is transmitted from the current controller to the communication I/O, and a current value is transmitted from the communication I/O to the current controller. A position and a speed detectors are arranged in the three-phase motor to detect a rotating angle and a rotating speed of the motor. The signals of the rotating angle and the rotating speed are transmitted to the position controller and the speed controller to be compared with a position command and a speed command, respectively. In the inverter of the present configuration having the vector control function, the motor is controlled using current values each of which is obtained by integrating a current value generated in the emitter inductance. In a conventional vector control inverter, currents are measured by inserting current sensors such as current transformers to the wires W1, W2 and W3. However, since the configuration according to the present invention needs no current sensors such as current transformers, the inverter system can be made small in size and low in cost.

FIG. 12 shows the example of vector control in which the motor is controlled by detecting the rotating position and the rotating speed of the motor. However, it is obvious that the present invention is also effective in the vector control which controls a motor without detecting the rotating position and the rotating speed. Therefore, detailed description on it is omitted here.

Although the embodiments of the present invention have been described in the cases of using IGBTs, the other kinds of switching elements such as MOSFET may be used instead of the IGBT.

According to the present invention, currents flowing in a load can be measured with high accuracy because the current is obtained by integrating a voltage generated in the inductor in the main circuit of the electric power converting system.

What is claimed is:

1. An electric power converting system comprising:
   a semiconductor switching element;
   a gate driving circuit for turning on and off said semiconductor switching element;
   an inductor connected in series to a main terminal of said switching element; and
   an integrating circuit for integrating voltage generated between both ends of said inductor and for providing an output indicative of current flowing through said inductor;
   wherein said semiconductor switching element is one of an IGBT and a MOSFET.

2. An electric power converting system according to claim 1, wherein a current flowing through said semiconductor switching element is obtained by interpolating between currents read at switching on and off of said semiconductor switching element.

3. An electric power converting system according to claim 1, wherein an output current of said electric power converting system is obtained by interpolating between currents read at switching on and off of said semiconductor switching element.

4. An electric power converting system comprising:
   a semiconductor switching element:
      a gate driving circuit for turning on and off said semiconductor switching element;
      an inductor connected in series to a main terminal of said semiconductor switching element;
      an integrating circuit for integrating a voltage generated between both ends of said inductor and for providing an output indicative of current flowing through said inductor;
      a comparing circuit for comparing the output from said integrating circuit with a command value; and
      a switching circuit for switching so as to provide an output of an OFF pulse to said gate driving circuit when an OFF pulse is output from said comparing circuit;
   wherein said semiconductor switching element is turned off when the output from said integrating circuit exceeds the command value, and said semiconductor switching element is one of an IGBT and a MOSFET.

5. An electric power converting system comprising:
   a semiconductor switching element:
      a gate driving circuit for turning on and off said semiconductor switching element;
      an inductor connected in series to a main terminal of said semiconductor switching element;
      an integrating circuit for integrating a voltage generated between both ends of said inductor and for providing an output indicative of current flowing through said inductor;
      a current reading circuit for reading a current value from the output of said integrating circuit; and
      a temporary memory circuit for temporarily storing the current value;
   wherein a magnitude of current to be input to a gate of said semiconductor switching element is varied corresponding to the current value stored in said memory circuit when the voltage between main terminals of said semiconductor switching element is being varied, and said semiconductor switching element is one of an IGBT and a MOSFET.

6. An electric power converting system according to claim 5, wherein as the current flowing through said semiconductor switching element increases more during a turn-on period, the current to be input to the gate of said semiconductor switching element when the voltage between the main terminals of said semiconductor switching element is being varied is increased more.

7. An electric power converting system according to claim 5, wherein as the current flowing through said semiconductor switching element increases more during a turn-on period, the current to be input to the gate of said semiconductor switching element when the voltage between the main terminals of said semiconductor switching element is being varied is decreased less.

8. An electric power converting system according to any one of claims 1, 4 and 5, which comprises a module containing said semiconductor switching element, wherein said inductor which is connected to the main terminal of said semiconductor switching element is provided as a parasitic inductance possessed by a wire inside said module.

9. An electric power converting system according to any one of claims 1, 4 and 5, wherein said integrating circuit comprises an operational amplifier; a capacitor; and a resistor.

10. An electric power converting system according to any one of claims 1, 4 and 5, the output of said integrating circuit is reset prior to switching of said semiconductor switching element.

11. An electric power converting system according to claim 10, wherein said integrating circuit comprises at least one operational amplifier; a resistor connected to a negative side terminal of said operational amplifier; and a capacitor and a switch both connected between an output terminal and a negative side terminal of said operational amplifier, wherein the output of said integrating circuit is reset by controlling said switch prior to switching of said semiconductor switching element.

* * * * *